United States Patent
Zhang et al.

(10) Patent No.: US 12,247,761 B2
(45) Date of Patent: Mar. 11, 2025

(54) SYSTEM AND METHOD FOR COMPREHENSIVE UTILIZATION OF RENEWABLE ENERGY AND WASTE HEAT OF DATA CENTER

(71) Applicant: GUANGZHOU INSTITUTE OF ENERGY CONVERSION, CHINESE ACADEMY OF SCIENCES, Guangzhou (CN)

(72) Inventors: Bobo Zhang, Guangzhou (CN); Kaijun Dong, Guangzhou (CN); Qin Sun, Guangzhou (CN); Weimin Luo, Guangzhou (CN)

(73) Assignee: GUANGZHOU INSTITUTE OF ENERGY CONVERSION, CHINESE ACADEMY OF SCIENCES, Guangzhou (CN)

( * ) Notice: Subject to any disclaimer, the term of this patent is extended or adjusted under 35 U.S.C. 154(b) by 208 days.

(21) Appl. No.: 17/921,366

(22) PCT Filed: Aug. 31, 2021

(86) PCT No.: PCT/CN2021/115502
§ 371 (c)(1),
(2) Date: Oct. 26, 2022

(87) PCT Pub. No.: WO2022/116608
PCT Pub. Date: Jun. 9, 2022

(65) Prior Publication Data
US 2023/0184446 A1  Jun. 15, 2023

(30) Foreign Application Priority Data
Jul. 12, 2021 (CN) .......................... 202110785497.2

(51) Int. Cl.
*F24F 5/00* (2006.01)
*F25B 27/00* (2006.01)
(Continued)

(52) U.S. Cl.
CPC ............ *F24F 5/0003* (2013.01); *F24F 5/001* (2013.01); *F24F 5/0017* (2013.01);
(Continued)

(58) Field of Classification Search
CPC ........ F24F 11/875; F24F 5/0003; F24F 5/001; F24F 5/0017; F24F 5/0046;
(Continued)

(56) References Cited

U.S. PATENT DOCUMENTS 4,796,439 A * 1/1989 Yamada .................... F24F 11/84
62/159
4,843,832 A * 7/1989 Yamada .................... F24F 3/08
165/300
(Continued)

FOREIGN PATENT DOCUMENTS

CN   103940145 A   7/2014
CN   205299850 U   6/2016
(Continued)

*Primary Examiner* — Nelson J Nieves
(74) *Attorney, Agent, or Firm* — Bayramoglu Law Offices LLC (57) ABSTRACT

A system and a method for comprehensive utilization of renewable energy and waste heat of a data center are provided. The system includes a data center, a water cistern, a water circulating system and a refrigerant circulating system. The water cistern is used to adopt heating capacity of the data center to complete a heat storage process within a set first period, and adopt the heating capacity stored in the heat storage process to supply a heat release process within a set second period. The water circulating system is provided with a plurality of water circulating loops. The refrigerant
(Continued)

circulating system is provided with a plurality of circulating systems. The heat storage process and the heat release process are implemented by cooperation of the plurality of water circulating loops and/or the plurality of circulating systems, which may effectively reduce heat costs of users in winter.

16 Claims, 1 Drawing Sheet

(51) Int. Cl.
    *F25B 30/02*     (2006.01)
    *F25B 41/40*     (2021.01)
    *H05K 7/20*     (2006.01)

(52) U.S. Cl.
    CPC .......... *F24F 5/0046* (2013.01); *F25B 27/007* (2013.01); *F25B 30/02* (2013.01); *F25B 41/40* (2021.01); *H05K 7/2079* (2013.01); *H05K 7/20836* (2013.01); *F24F 2005/0025* (2013.01); *F24F 2005/0064* (2013.01)

(58) Field of Classification Search
    CPC ............. F24F 2005/0025; F24D 3/082; H05K 7/2079; H05K 7/20836; Y02E 60/14
    See application file for complete search history.

(56) References Cited

U.S. PATENT DOCUMENTS

| | | | |
|---|---|---|---|
| 5,131,238 A * | 7/1992 | Meckler | F24F 1/00 |
| | | | 62/271 |
| 10,605,477 B2 * | 3/2020 | Ridder | F24F 11/84 |
| 2010/0307171 A1 | 12/2010 | Hamann et al. | |
| 2011/0146317 A1 * | 6/2011 | Cline | F25B 7/00 |
| | | | 62/238.7 |
| 2013/0312444 A1 * | 11/2013 | Platt | F24F 5/0017 |
| | | | 62/238.1 |
| 2017/0336085 A1 * | 11/2017 | Yasuo | F24F 5/0017 |
| 2018/0172287 A1 * | 6/2018 | Göransson | F24H 15/375 |
| 2020/0278135 A1 * | 9/2020 | Park | F25B 30/06 |
| 2021/0207834 A1 * | 7/2021 | Ukibune | F24F 11/86 |

FOREIGN PATENT DOCUMENTS

| | | |
|---|---|---|
| CN | 106642799 A | 5/2017 |
| CN | 208968087 U | 6/2019 |
| CN | 111121133 A | 5/2020 |
| CN | 213178638 U | 5/2021 |
| CN | 215412275 U | 1/2022 |
| JP | 2011247506 A | 12/2011 |

* cited by examiner

SYSTEM AND METHOD FOR COMPREHENSIVE UTILIZATION OF RENEWABLE ENERGY AND WASTE HEAT OF DATA CENTER

CROSS REFERENCE TO THE RELATED APPLICATIONS

This application is the national phase entry of International Application No. PCT/CN2021/115502, filed on Aug. 31, 2021, which is based upon and claims priority to Chinese Patent Application No. 202110785497.2, filed on Jul. 12, 2021, the entire contents of which are incorporated herein by reference.

TECHNICAL FIELD

The present invention relates to a field of renewable energy and waste heat comprehensive utilization technologies, and more particularly, to a system and a method for comprehensive utilization of renewable energy and waste heat of a data center.

BACKGROUND

During operation of a server in a data center, a large amount of waste heat of medium and low grades will be released. The waste heat is easy to extract, produced stably and extensive in quantity, which is a high-quality heat source that may heat domestic water, supply heat, or meet other heat needs. There are about 80,000 data centers in China. Calculated according to an existing data center scale, the total recoverable waste heat of data centers in north China is about 10 GW, which may theoretically supply heat to 300 million square meters of buildings. Recovering the waste heat of the data centers for local heat supply has broad market prospects and energy saving significance in north China.

However, at the present stage, most of the waste heat of the data center is directly discharged to the atmosphere, which is a huge waste. Currently, only a few data centers of some companies are application cases of waste heat recovery and utilization systems such as Alibaba Qiandaohu Data Center, Tencent Tianjin Data Center and China Telecom Chongqing Cloud Computing Base. Key links of energy saving in our country's data center industry are air-conditioning systems and IT systems, but waste heat recovery and utilization are usually neglected. With rapid growth of construction scales and the number of data centers, the government has higher and higher requirements for energy saving in data centers.

On the other hand, China is rich in renewable energy resources, and contribution of in-depth development of renewable energy also has broad development prospects in the fields of data center energy saving and local cooling and heating. Obviously, comprehensive utilization of renewable energy and waste heat has become an urgent technical problem to be solved.

SUMMARY

In view of deficiencies in the existing technologies, the present invention provides a system and a method for comprehensive utilization of renewable energy and waste heat of a data center. In non-winter, the waste heat generated by the data center is stored in a large water cistern through a multi-temperature zone continuous heat collection technology; in the whole process, the large water cistern sequentially serves as a cross-season cold source for a data center direct supply, a refrigeration unit condensing end, and a refrigeration unit heat recovery end, and finally is assisted by a solar heat collector to heat up to a target heating temperature; in winter, data center waste heat, solar energy and large water cistern heating capacity implement cold region cross-season low-carbon heating respectively through a high-efficiency heat pump technology, a solar photothermal technology and a multi-temperature zone continuous heat release technology; the system operates stably throughout the year and rolls on in cycles, which may effectively reduce heat costs of users in winter and reduce combustion of fossil fuels, generation of carbon dioxide and a PUE value of the data center, and has important economic values and environmental protection values.

In order to achieve the above-described objective, the technical solution of the present invention is:

A system for comprehensive utilization of renewable energy and waste heat, including:
  A data center;
  A water cistern, used to: adopt heating capacity of the data center to complete a heat storage process within a set first period, and adopt the heating capacity stored in the heat storage process to supply a heat release process within a set second period;
  A water circulating system, provided with a plurality of water circulating loops; and,
  A refrigerant circulating system, provided with a plurality of circulating systems; wherein,
  The heat storage process and the heat release process are implemented by cooperation of the plurality of water circulating loops and/or the plurality of circulating systems.

In the above-described system for comprehensive utilization of renewable energy and waste heat, further, the water circulating system includes:
  A first water circulating loop, including: a first plate heat exchanger, a water cistern, a cooling tower, and a first heat pump evaporator, wherein one end of the first plate heat exchanger is respectively in communication with the water cistern, the cooling tower and the first heat pump evaporator;
  A second water circulating loop, including: a refrigeration unit condensing end, the water cistern, and the cooling tower, wherein one end of the refrigeration unit condensing end is respectively in communication with the water cistern and the cooling tower;
  A third water circulating loop, including: a refrigeration unit heat recovery end and the water cistern, wherein the refrigeration unit heat recovery end is in communication with the water cistern;
  A fourth water circulating loop, including: the data center, the first plate heat exchanger and a refrigeration unit evaporator, wherein a cooling water supply/return water interface of the data center is respectively in communication with the first plate heat exchanger and the refrigeration unit evaporator;
  A fifth water circulating loop, including: a solar heat collector, the water cistern, and a buffer water tank, wherein the solar heat collector is respectively in communication with the large water cistern and the buffer water tank; and,
  A sixth water circulating loop, including: the buffer water tank, the solar heat collector, a first heat pump condenser, a second heat pump condenser, and a second plate heat exchanger, wherein the buffer water tank is respectively in communication with the large water cistern, the solar heat collector, the first heat pump condenser, the second heat pump condenser, and the second plate heat exchanger.

In the above-described system for comprehensive utilization of renewable energy and waste heat, further, the refrigerant circulating system includes:

A refrigeration unit circulating system, including the refrigeration unit evaporator, a compressor, a refrigeration unit heat recovery end, a refrigeration unit condensing end, and a throttling apparatus, wherein the refrigeration unit evaporator constitutes one end of a heat exchange process; the refrigeration unit heat recovery end and the refrigeration unit condensing end constitutes the other end of the heat exchange process; and the compressor and the throttling apparatus promote the heat exchange process;

A first heat pump circulating system, including a first heat pump evaporator, a compressor, the first heat pump condenser and a throttling apparatus, wherein the first heat pump evaporator constitutes one end of the heat exchange process; the first heat pump condenser constitutes the other end of the heat exchange process; and the compressor and the throttling apparatus promote the heat exchange process; and, A second heat pump circulating system, including the second heat pump evaporator, the compressor, the second heat pump condenser and the throttling apparatus, wherein the second heat pump evaporator constitutes one end of the heat exchange process; the second heat pump condenser constitutes the other end of the heat exchange process; and the compressor and the throttling apparatus promote the heat exchange process.

In the above-described system for comprehensive utilization of renewable energy and waste heat, further, a top layer of the water cistern is hot water and a bottom layer is cold water, wherein when outlet water is hot water and return water is cold water, the water cistern carries out water circulation in a mode of outlet water at the top and return water at the bottom; and when outlet water is cold water and return water is hot water, the water cistern carries out water circulation in a mode of outlet water at the bottom and return water at the top.

In the above-described system for comprehensive utilization of renewable energy and waste heat, further, a thermal insulation layer is provided at the top and in the periphery of the water cistern.

In the above-described system for comprehensive utilization of renewable energy and waste heat, further, a heat source of the second heat pump evaporator includes a water source of the water cistern or an air source, wherein when the water pump drives the water circulating loop, the water source of the water cistern serves as a heat source; when the water circulating loop is shut down, a fan of the second heat pump evaporator is driven, and at this time, the air source serves as a heat source.

In the above-described system for comprehensive utilization of renewable energy and waste heat, further, the first period includes spring, summer, and autumn; and the second period includes winter.

In the above-described system for comprehensive utilization of renewable energy and waste heat, further, the heat storage process is a process of raising from water at 0° C. with a certain ice content to water at 90° C.; and the heat release process is a process of reducing from water at 90° C. to water at 0° C. with a certain ice content.

An operation method for comprehensive utilization of renewable energy and waste heat, which utilizes the above-described system for comprehensive utilization of renewable energy and waste heat, The heat storage process includes:

A first heat storage stage, used when a water temperature of the water cistern is in a first heat storage temperature interval, wherein the process includes: starting up the water circulating loop composed of the water cistern and the first plate heat exchanger; starting up the refrigeration unit circulating system; shutting down all other water circulating loops and refrigerant circulating systems; and directly supplying, by the water cistern, cooling capacity to the data center;

A second heat storage stage, used when the water temperature of the water cistern is in a second heat storage temperature interval, wherein the process includes: starting up the water circulating loop composed of the water cistern and the refrigeration unit condensing end; starting up the refrigeration unit circulating system; shutting down all other water circulating loops and refrigerant circulating systems; and directly supplying, by the water cistern, cooling capacity to the refrigeration unit condensing end;

A third heat storage stage, used when the water temperature of the water cistern is in a third heat storage temperature interval, wherein the process includes: starting up the water circulating loop composed of the water cistern and the refrigeration unit heat recovery end; starting up the water circulating loop composed of the solar heat collector and the buffer water tank; starting up the refrigeration unit circulating system; shutting down all other water circulating loops and refrigerant circulating systems; supplying, by the water cistern, cooling capacity to the refrigeration unit heat recovery end; meanwhile, storing, by the solar heat collector, heating capacity for the buffer water tank; when a temperature of the buffer water tank is raised to a first set temperature, exchanging hot and cold water with a water cistern top water layer, and repeating the period;

A fourth heat storage stage, used when a water temperature of the water cistern is in a fourth heat storage temperature interval, wherein the process includes: starting up the water circulating loop composed of the water cistern and the solar heat collector; shutting down all other water circulating loops and refrigerant circulating systems; and supplying, by the solar heat collector, stored heating capacity to the water cistern.

The heat release process includes:

A first heat release stage, used when a water temperature of the water cistern is in a first heat release temperature interval, wherein the process includes: starting up the water circulating loop composed of the water cistern and the buffer water tank; starting up the water circulating loop composed of the buffer water tank and the second plate heat exchanger; and shutting down all other water circulating loops and refrigerant circulating systems;

A second heat release stage, used when a water temperature of the water cistern is in a second heat release temperature interval, wherein the process includes: starting up the water circulating loop composed of the data center water supply/return water interface and the first plate heat exchanger; starting up the water circulating loop composed of the first plate heat exchanger and the first heat pump evaporator; starting up the water circulating loop composed of the first heat pump condenser and the buffer water tank; starting up the first heat pump circulating system; starting up the water circulating loop composed of the buffer water tank and the first heat pump condenser; starting up the water circulating loop composed of the solar heat collector and the buffer water tank; starting up the water circulating loop composed of the water cistern and the second heat pump evaporator; starting up the water circulating loop composed of the second heat pump condenser and the buffer water tank; starting up the second heat pump circulating system; starting up the water circulating loop composed of the buffer water tank and the second plate heat exchanger; and shutting down all other water circulating loops and refrigerant circulating loops.

In the above-described operation method for comprehensive utilization of renewable energy and waste heat, further, the first heat storage stage has a temperature of 0° C. to 20° C.; the second heat storage stage has a temperature of 21° C. to 37° C.; the third heat storage stage has a temperature of 38° C. to 60° C.; the fourth heat storage stage has a temperature of 61° C. to 90° C.; the first heat release temperature interval has a water temperature of 37° C. to 90° C.; and the second heat release stage has a water temperature of 0° C. to 37° C.

As compared with the existing technology, the present invention has advantageous effects below:

1. The system for comprehensive utilization of renewable energy and waste heat of a data center proposed by the present invention implements a cross-season energy supply mode in which cooling capacity is stored in winter and supplied in summer, and heating capacity is stored in summer and supplied in winter through the cross-season cold storage and heat storage technology, which solves seasonal discontinuity and volatility problems of renewable energy.

2. The system for comprehensive utilization of renewable energy and waste heat of a data center proposed by the present invention has broad market prospects and energy-saving significance in North China, wherein large-scale reuse of waste heat in data centers may indirectly reduce carbon dioxide produced due to use of fossil fuels, while helping users reduce heating costs, which has important economic values and environmental protection values.

3. The system for comprehensive utilization of renewable energy and waste heat of a data center proposed by the present invention has the cross-season water cistern directly supply cooling capacity to the data center, which reduces power consumption of refrigeration devices among total power consumption of the data center, thereby effectively reducing the PUE value, and is beneficial for the data center to enhance a brand value, to guide the data center to take a high-efficiency low-carbon intensive, circular, green development path.

BRIEF DESCRIPTION OF THE DRAWINGS

In order to clearly illustrate the technical solution of the embodiments of the present invention, the drawings that need to be used in the embodiments will be briefly described in the following; it is obvious that the described drawings are only related to some embodiments of the present invention; based on the drawings, those ordinarily skilled in the art can acquire other drawings, without any inventive work.

Figure 1:
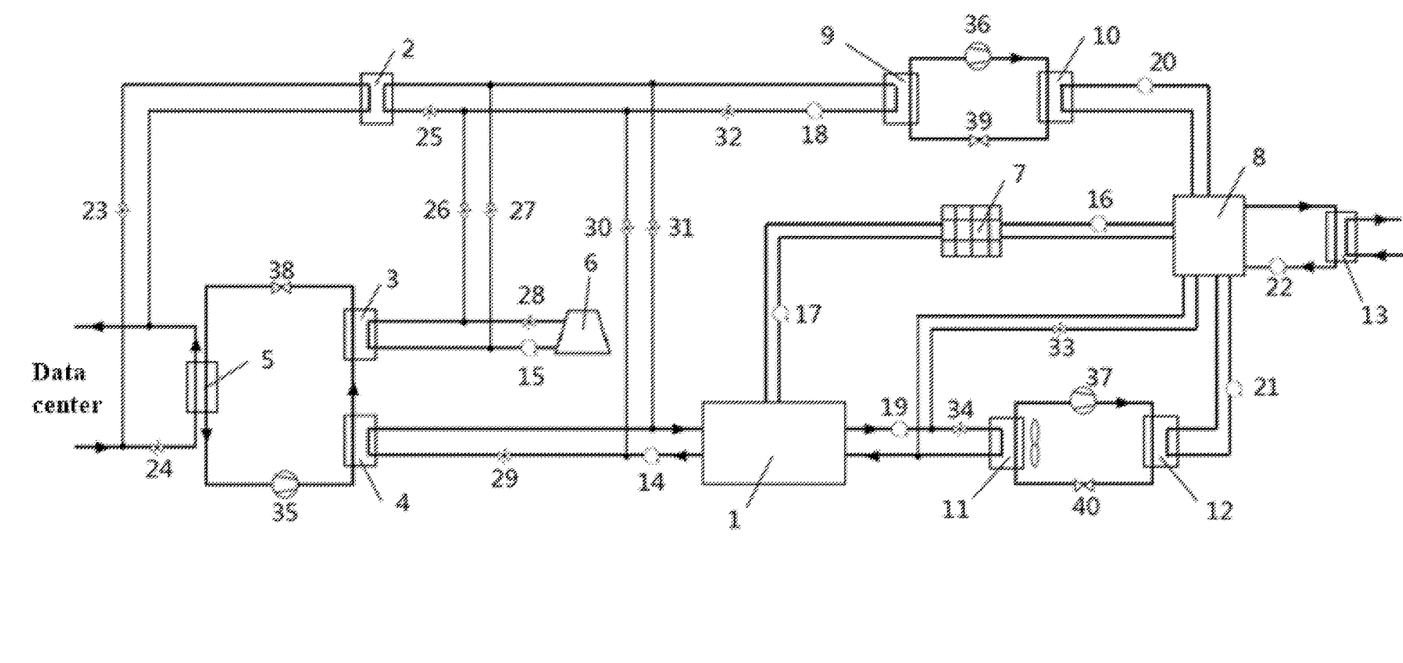
FIGURE is a structural schematic diagram of a system for comprehensive utilization of renewable energy and waste heat of a data center.

DESCRIPTION OF REFERENCE SIGNS 1. large water cistern; 2. first plate heat exchanger; 3. refrigeration unit condensing end; 4. refrigeration unit heat recovery end; 5. refrigeration unit evaporator; 6. cooling tower; 7. solar heat collector; 8. buffer water tank; 9. first heat pump evaporator; 10. first heat pump condenser; 11. second heat pump evaporator; 12. second heat pump condenser; 13. second plate heat exchanger; 14 to 22. water pump; 23 to 34. shut-off valve; 35 to 37. compressor; 38-40. throttling apparatus.

DETAILED DESCRIPTION OF THE EMBODIMENTS

The technical solutions of the embodiments of the present invention will be described in a clearly and fully understandable way in connection with the drawings related to the embodiments of the present invention. It is obvious that the described embodiments are just a part but not all of the embodiments of the present invention. Based on the described embodiments herein, those ordinarily skilled in the art can acquire other embodiment(s), without any inventive work, which should be within the scope of the present invention.

Embodiment

It should be noted that, terms "first", "second" and the like in the description and claims of the present invention as well as the above-described drawing are used to distinguish similar objects, and are not necessarily used to describe a specific order or sequence. It should be understood that, the data so used may be interchanged under appropriate circumstances such that the embodiments of the present invention described herein may be practiced in sequences other than those illustrated or described herein. In addition, terms "including" and "having" as well as any variations thereof according to the embodiments of the present invention are intended to cover non-exclusive inclusion, for example, a process, a method, a system, a product or a device comprising a series of steps or units is not necessarily limited to those steps or units that are expressly listed, but may instead include other steps or units that are not expressly listed or are inherent to the process, the method, the product or the device.

It should be understood that directional or positional relationships shown by the terms such as "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", and "circumferential" are directional or positional relationships shown as in the drawings, which only intends to facilitate description of the present invention and simplify the description, but do not indicate or imply that the apparatuses or components must have specific directions, or be constructed or operated in the specific directions, and are not limitative of the present invention.

In the description of the present invention, the term "a plurality of" refers to at least two, for example, two, three, etc. unless otherwise specifically defined. In addition, unless otherwise unambiguously specified and defined, terms like "mounting", "coupling" and "connecting" should be construed in its broad sense, for example, it may be fixed connection, or detachable connection, or integral connection; or may also be mechanical connection or electrical connection; or may also be direct connection, or indirect connection through an intermediate medium; or may also be internal communication between two components. It will be understood by those ordinarily skilled in the art that the specific meanings of the above terms vary in different contexts.

FIGURE is a structural schematic diagram of a system for comprehensive utilization of renewable energy and waste heat of a data center.

The present invention provides a system and a method for comprehensive utilization of renewable energy and waste heat of a data center. In non-winter, the waste heat generated by the data center is stored in a large water cistern through a multi-temperature zone continuous heat collection technology; in the whole process, the large water cistern sequentially serves as a cross-season cold source for a data center direct supply, a refrigeration unit condensing end, and a refrigeration unit heat recovery end, and finally is assisted by a solar heat collector to heat up to a target heating temperature; in winter, data center waste heat, solar energy and large water cistern heating capacity implement cold region cross-season low-carbon heating respectively through a high-efficiency heat pump technology, a solar photothermal technology and a multi-temperature zone continuous heat release technology; the system operates stably throughout the year and rolls on in cycles, which may effectively reduce heat costs of users in winter and reduce combustion of fossil fuels, generation of carbon dioxide and a PUE value of the data center, and has important economic values and environmental protection values.

As shown in FIGURE, in the embodiment of the present invention, the system for comprehensive utilization of renewable energy and waste heat of a data center includes a large water cistern 1, a first plate heat exchanger 2, a refrigeration unit condensing end 3, a refrigeration unit heat recovery end 4, a refrigeration unit evaporator 5, a cooling tower 6, a solar heat collector 7, a buffer water tank 8, a first heat pump evaporator 9, a first heat pump condenser 10, a second heat pump evaporator 11, a second heat pump condenser 12, a second plate heat exchanger 13, a plurality of water pumps 14 to 22, a plurality of shut-off valves 23 to 34, compressors 35 to 37, and throttling apparatuses 38 to 40. The system for comprehensive utilization of renewable energy and waste heat of a data center includes a water circulating system and a refrigerant circulating system; and the water circulating system and the refrigerant circulating system exchange heat respectively through heat exchangers such as the first plate heat exchanger 2, the refrigeration unit condensing end 3, the refrigeration unit heat recovery end 4, the refrigeration unit evaporator 5, the first heat pump evaporator 9, the first heat pump condenser 10, the second heat pump evaporator 11, and the second heat pump condenser 12, etc.

The large water cistern 1, as a core apparatus of the whole system, is filled with water during normal operation, and is required to form an independent water circulating loop respectively with the first plate heat exchanger 2, the refrigeration unit condensing end 3, the refrigeration unit heat recovery end 4, the solar heat collector 7, the buffer water tank 8, and the second heat pump evaporator 11; the large water cistern 1 is provided with thermal insulation materials in the periphery and at the top, which are not schematically shown; the large water cistern 1 adopts a layered design idea of hot water distribution at the top and cold water distribution at the bottom, to arrange a water outlet mode of the water circulating loop; when outlet water is hot water and return water is cold water, a mode of outlet water at the top and return water at the bottom is preferred for water circulation; when outlet water is cold water and return water is hot water, a mode of outlet water at the bottom and return water at the top is preferred for water circulation.

The water circulating loops mainly includes: an independent water circulating loop formed by the first plate heat exchanger 2 respectively with the large water cistern 1, the cooling tower 6, and the first heat pump evaporator 9; an independent water circulating loop formed by the refrigeration unit condensing end 3 respectively with the large water cistern 1 and the cooling tower 6; an independent water circulating loop formed by the refrigeration unit heat recovery end 4 only with the large water cistern 1; an independent water circulating loop formed by the data center cooling water supply/return water interface respectively with the first plate heat exchanger 2 and the refrigeration unit evaporator 5; an independent water circulating loop formed by the solar heat collector 7 respectively with the large water cistern 1 and the buffer water tank 8; and an independent water circulating loop formed by the buffer water tank 8 respectively with the large water cistern 1, the solar heat collector 7, the first heat pump condenser 10, the second heat pump condenser 12, and the second plate heat exchanger 13.

The refrigerant circulating systems include: a refrigeration unit circulating system, a first heat pump circulating system and a second heat pump circulating system. The refrigerant circulating system is mainly composed of the refrigeration unit evaporator 5, the compressor 35, the refrigeration unit heat recovery end 4, the refrigeration unit condensing end 3, and the throttling apparatus 38; the first heat pump circulating system is mainly composed of the first heat pump evaporator 9, the compressor 36, the first heat pump condenser 10, and the throttling apparatus 39; the second heat pump circulating system is mainly composed of the second heat pump evaporator 11, the compressor 37, the second heat pump condenser 12, and the throttling apparatus 40. A heat source of the second heat pump evaporator 11 may be a water source from the large water cistern 1 or an air source; when the water pump 19 drives the water circulating loop, the water source of the large water cistern 1 is used as the heat source; when the water circulating loop is shut down, the fan of the second heat pump evaporator 11 is driven, and at this time, the air source is used as the heat source.

The water pumps 14 to 22 and the shut-off valves 23 to 34 may freely switch between respective operation modes according to actual needs.

Based on the above-described system, the present invention further proposes an operation method of the system for comprehensive utilization of renewable energy and waste heat of a data center, which focuses on a heat storage process and a heat release process of the large water cistern 1, to implement cross-season local cooling and heating.

The heat storage process is also referred to as a cooling release process, and requires the waste heat utilizing system to implement changing a temperature of the large water cistern from 0° C. to 90° C. in spring, summer and autumn, wherein when the temperature of the large water cistern 1 is 0° C., a corresponding ice content is about 40%; and a specific implementation process is as follows:

(1) When the temperature of the large water cistern 1 is 0° C. to 20° C., it enters a large water cistern direct cooling mode; at this time, the water circulating loop composed of the large water cistern 1 and the first plate heat exchanger 2 is started up, other water circulating loops and refrigerant circulating loops are all shut down; and the large water cistern 1 directly supplies cooling capacity to a cooling water loop of the data center.

(2) When the temperature of large water cistern 1 is 21° C. to 37° C., it enters a large water cistern-condensing end cooling mode; at this time, the refrigeration unit circulating system loop (components 3, 4, 5, 35 and 38) is started up; the water circulating loop composed of the large water cistern 1 and the refrigeration unit condensing end 3 is started up; other water circulating loops and refrigerant circulating loops are all shut down; and the large water cistern 1 supplies cooling capacity to the refrigeration unit condensing end 3.

(3) When the temperature of the large water cistern 1 is 38° C. to 60° C., it enters a large water cistern-heat recovery end cooling mode; at this time, the refrigeration unit system circulating loop (components 3, 4, 5, 35 and 38) is started up; the water circulating loop composed of the large water cistern 1 and the refrigeration unit heat recovery end 4 is started up; the water circulating loop composed of the solar heat collector 7 and the buffer water tank 8 is started up; other water circulating loops and refrigerant circulating loops are all shut down; the large water cistern 1 supplies cooling capacity to the refrigeration unit heat recovery end 4; meanwhile, the solar heat collector 7 stores heating capacity for the buffer water tank 8; and when the temperature of the buffer water tank rises to 90° C., hot water and cold water exchanging is performed with the top water layer of the large water cistern 1, and the process is repeated.

(4) When the temperature of the large water cistern 1 is 61° C. to 90° C., it enters a large water cistern-heat collector mode, wherein the water circulating loop composed of the large water cistern 1 and the solar heat collector 7 is started up; other water circulating loops and refrigerant circulating loops are all shut down; and the solar heat collector 7 supplies stored heating capacity to the large water cistern 1. The water temperature of the large water cistern 1 is required to reach about 90° C. from the beginning of spring to the end of autumn.

The heat release process is also referred to as a cold storage process, and requires the waste heat utilizing system to implement changing the temperature of the large water cistern from 90° C. to 0° C. in winter.

(1) When the temperature of large water cistern 1 is 0° C., a corresponding ice content is about 40%; and a specific implementation process is as follows: when the water temperature of large water cistern 1 is 37° C. to 90° C., it enters a large water cistern direct heating mode, wherein the water circulating loop composed of the large water cistern 1 and the buffer water tank 8 is started up; the water circulating loop composed of the buffer water tank 8 and the second plate heat exchanger 13 is started up, and other water circulating loops and refrigerant circulating loops are all shut down.

(2) When the water temperature of the large water cistern 1 is 0° C. to 37° C., it enters a buffer water tank compound heating mode; at this time, the water circulating loop composed of the data center water supply/return and the first plate heat exchanger 2 is started up; the water circulating loop composed of the first plate heat exchanger 2 and the first heat pump evaporator 9 is started up; the water circulating loop composed of the first heat pump condenser 10 and the buffer water tank 8 is started up; the first heat pump circulating system (components 9, 10, 36, 39) is started up; the water circulating loop composed of the buffer water tank 8 and the first heat pump condenser is started up; the water circulating loop composed of the solar heat collector 7 and the buffer water tank 8 is started up; the water circulating loop composed of the large water cistern 1 and the second heat pump evaporator 11 is started up; the water circulating loop composed of the second heat pump condenser 12 and the buffer water tank 8 is started up; the second heat pump circulating system (components 11, 12, 37, 40) is started up; the water circulating loop composed of the buffer water tank 8 and the second plate heat exchanger 13 is started up; and other water circulating loops and refrigerant circulating loops are shut down, to implement winter local heating under the multi-combination system, which requires the water temperature of the large water cistern 1 to reach 0° C. with an ice content of about 40% at the end of winter.

In the description of the present invention, descriptions with reference to the terms "one embodiment", "some embodiments", "examples", "specific examples", or "some examples", etc. mean that specific features, structures, materials or characteristics described in conjunction with the embodiment or example, are included in at least one embodiment or example of the embodiments of the present invention. In the present invention, the schematic representations of the above-described terms do not necessarily refer to the same embodiment or example. Moreover, the described specific features, structures, materials or characteristics may be combined in any one or more embodiments or examples in a suitable manner. In addition, those skilled in the art may combine or compose different embodiments or examples and features of different embodiments or examples described in the present invention without contradicting each other.

The above-described embodiments are only intended to illustrate the technical concept and characteristics of the present invention, and the purpose thereof is to enable those ordinarily skilled in the art to understand the content of the present invention and implement the same accordingly, and not to limit the protection scope of the present invention. All equivalent changes or modifications made according to the essence of the present invention shall be included within the protection scope of the present invention.

What is claimed is:

1. A system for comprehensive utilization of renewable energy and waste heat, comprising:
    a data center;
    a water cistern, wherein: the water cistern adopts heating capacity of the data center to complete a heat storage process within a set first period, and adopts the heating capacity stored in the heat storage process to supply a heat release process within a set second period;
    a water circulating system, provided with a plurality of water circulating loops; and
    a refrigeration circulating system, provided with a plurality of refrigerant circulating systems; wherein,
    the heat storage process and the heat release process are implemented by cooperation of the plurality of water circulating loops and/or the plurality of refrigerant circulating systems;
    the water circulating system comprises:
    a first water circulating loop, comprising: a first plate heat exchanger, the water cistern, a cooling tower, and a first heat pump evaporator, wherein one end of the first plate heat exchanger is in communication with the water cistern, the cooling tower and the first heat pump evaporator;
    a second water circulating loop, comprising: a refrigeration unit condensing end, the water cistern, and the cooling tower, one end of the refrigeration unit condensing end is in communication with the water cistern and the cooling tower;

a third water circulating loop, comprising: a refrigeration unit heat recovery end and the water cistern, the refrigeration unit heat recovery end being in communication with the water cistern;

a fourth water circulating loop, comprising: the data center, the first plate heat exchanger and a refrigeration unit evaporator, a cooling water supply/return water interface of the data center is in communication with the first plate heat exchanger and the refrigeration unit evaporator;

a fifth water circulating loop, comprising: a solar heat collector, the water cistern, and a buffer water tank, the solar heat collector is in communication with the water cistern and the buffer water tank; and a sixth water circulating loop, comprising: the buffer water tank, the solar heat collector, a first heat pump condenser, a second heat pump condenser, and a second plate heat exchanger, the buffer water tank is in communication with the water cistern, the solar heat collector, the first heat pump condenser, the second heat pump condenser, and the second plate heat exchanger.

2. The system for comprehensive utilization of renewable energy and waste heat according to claim 1, wherein
the refrigeration circulating system comprises:
a refrigeration unit circulating system, comprising the refrigeration unit evaporator, a first compressor, the refrigeration unit heat recovery end, the refrigeration unit condensing end, and a first throttling apparatus, the refrigeration unit evaporator constituting a first end of a first heat exchange process; the refrigeration unit heat recovery end and the refrigeration unit condensing end constituting a second end of the first heat exchange process; and the first compressor and the first throttling apparatus promoting the first heat exchange process;

a first heat pump circulating system, comprising the first heat pump evaporator, a second compressor, the first heat pump condenser and a second throttling apparatus, the first heat pump evaporator constituting a first end of the heat exchange process; the first heat pump condenser constituting a second end of the second heat exchange process; and the second compressor and the second throttling apparatus promoting the second heat exchange process; and a second heat pump circulating system, comprising a second heat pump evaporator, a third compressor, the second heat pump condenser and a third throttling apparatus, the second heat pump evaporator constituting a first end of a third heat exchange process; the second heat pump condenser constituting a second end of the third heat exchange process; and the third compressor and the third throttling apparatus promoting the third heat exchange process.

3. The system for comprehensive utilization of renewable energy and waste heat according to claim 2, wherein
a top layer of the water cistern is hot water and a bottom layer of the water cistern is cold water;
when the water cistern outlet water is hot water and return water is cold water, the water cistern carries out water circulation in a mode of outlet water at the a top of the water cistern and return water at a bottom of the water cistern;
and when the water cistern outlet water is cold water and return water is hot water, the water cistern carries out water circulation in a mode of outlet water at the bottom of the water cistern and return water at the top of the water cistern.

4. The system for comprehensive utilization of renewable energy and waste heat according to claim 2, wherein
a thermal insulation layer is provided at a top and in a periphery of the water cistern.

5. The system for comprehensive utilization of renewable energy and waste heat according to claim 2, wherein
a heat source of the second heat pump evaporator comprises a water source of the water cistern or an air source; when a water pump drives the fifth water circulating loop, the water source of the water cistern serves as the heat source; when the fifth water circulating loop is shut down, a fan of the second heat pump evaporator is driven, and at this time, the air source serves as the heat source.

6. The system for comprehensive utilization of renewable energy and waste heat according to claim 2, wherein
the set first period comprises spring, summer, and autumn; and the set second period comprises winter.

7. The system for comprehensive utilization of renewable energy and waste heat according to claim 2, wherein
the heat storage process is a process of raising from water at 0° C. with a ice content to water at 90° C.;
and the heat release process is a process of reducing from water at 90° C. to water at 0° C. with a ice content.

8. An operation method for comprehensive utilization of renewable energy and waste heat, utilizing the system for comprehensive utilization of renewable energy and waste heat according to claim 1;
the heat storage process comprising:
a first heat storage stage, used when a water temperature of the water cistern is in a first heat storage temperature interval, wherein the process comprises: starting up a water circulating loop composed of the water cistern and a first plate heat exchanger; starting up a refrigeration unit circulating system; shutting down all other water circulating loops and refrigerant circulating systems; and directly supplying, by the water cistern, cooling capacity to the data center;

a second heat storage stage, used when the water temperature of the water cistern is in a second heat storage temperature interval, wherein the process comprises: starting up a water circulating loop composed of the water cistern and a refrigeration unit condensing end; starting up the refrigeration unit circulating system; shutting down all other water circulating loops and refrigerant circulating systems; and directly supplying, by the water cistern, cooling capacity to the refrigeration unit condensing end;

a third heat storage stage, used when the water temperature of the water cistern is in a third heat storage temperature interval, wherein the process comprises: starting up a water circulating loop composed of the water cistern and a refrigeration unit heat recovery end; starting up a water circulating loop composed of a solar heat collector and a buffer water tank; starting up the refrigeration unit circulating system; shutting down all other water circulating loops and refrigerant circulating systems; supplying, by the water cistern, cooling capacity to the refrigeration unit heat recovery end; meanwhile, storing, by the solar heat collector, heating capacity for the buffer water tank; when a temperature of the buffer water tank is raised to a first set temperature, exchanging hot and cold water with a water cistern top water layer, and repeating the period;

a fourth heat storage stage, used when the water temperature of the water cistern is in a fourth heat storage temperature interval, wherein the process comprises: starting up a water circulating loop composed of the water cistern and the solar heat collector; shutting down all other water circulating loops and refrigerant circulating systems; and supplying, by the solar heat collector, stored heating capacity to the water cistern;

the heat release process comprising:

a first heat release stage, used when the water temperature of the water cistern is in a first heat release temperature interval, wherein the process comprises: starting up a water circulating loop composed of the water cistern and the buffer water tank; starting up a water circulating loop composed of the buffer water tank and a second plate heat exchanger; and shutting down all other water circulating loops and refrigerant circulating systems;

a second heat release stage, used when the water temperature of the water cistern is in a second heat release temperature interval, wherein the process comprises: starting up a water circulating loop composed of a data center water supply/return water interface and the first plate heat exchanger; starting up a water circulating loop composed of the first plate heat exchanger and a first heat pump evaporator; starting up a water circulating loop composed of a first heat pump condenser and the buffer water tank; starting up a first heat pump circulating system; starting up the water circulating loop composed of the buffer water tank and the first heat pump condenser; starting up the water circulating loop composed of the solar heat collector and the buffer water tank; starting up a water circulating loop composed of the water cistern and a second heat pump evaporator; starting up a water circulating loop composed of a second heat pump condenser and the buffer water tank; starting up a second heat pump circulating system; starting up the water circulating loop composed of the buffer water tank and the second plate heat exchanger; and shutting down all other water circulating loops and refrigerant circulating loops.

9. The operation method for comprehensive utilization of renewable energy and waste heat according to claim 8, wherein the first heat storage stage has a temperature of 0° C. to 20° C.; the second heat storage stage has a temperature of 21° C. to 37° C.; the third heat storage stage has a temperature of 38° C. to 60° C.; the fourth heat storage stage has a temperature of 61° C. to 90° C.; the first heat release temperature interval has a water temperature of 37° C. to 90° C.; and the second heat release stage has a water temperature of 0° C. to 37° C.

10. The operation method for comprehensive utilization of renewable energy and waste heat according to claim 8, wherein the water circulating system comprises:

a first water circulating loop, comprising: the first plate heat exchanger, the water cistern, a cooling tower, and the first heat pump evaporator, one end of the first plate heat exchanger is in communication with the water cistern, the cooling tower and the first heat pump evaporator;

a second water circulating loop, comprising: the refrigeration unit condensing end, the water cistern, and the cooling tower, wherein one end of the refrigeration unit condensing end is in communication with the water cistern and the cooling tower;

a third water circulating loop, comprising: the refrigeration unit heat recovery end and the water cistern, the refrigeration unit heat recovery end being in communication with the water cistern;

a fourth water circulating loop, comprising: the data center, the first plate heat exchanger and a refrigeration unit evaporator, a cooling water supply/return water interface of the data center being is in communication with the first plate heat exchanger and the refrigeration unit evaporator;

a fifth water circulating loop, comprising: the solar heat collector, the water cistern, and the buffer water tank, the solar heat collector being is in communication with the water cistern and the buffer water tank; and a sixth water circulating loop, comprising: the buffer water tank, the solar heat collector, the first heat pump condenser, the second heat pump condenser, and the second plate heat exchanger, the buffer water tank being is in communication with the water cistern, the solar heat collector, the first heat pump condenser, the second heat pump condenser, and the second plate heat exchanger.

11. The operation method for comprehensive utilization of renewable energy and waste heat according to claim 10, wherein the refrigeration circulating system comprises:

the refrigeration unit circulating system, comprising the refrigeration unit evaporator, a first compressor, the refrigeration unit heat recovery end, the refrigeration unit condensing end, and a first throttling apparatus, the refrigeration unit evaporator constituting a first end of a first heat exchange process; the refrigeration unit heat recovery end and the refrigeration unit condensing end constituting a second end of the first heat exchange process; and the first compressor and the first throttling apparatus promoting the first heat exchange process;

the first heat pump circulating system, comprising the first heat pump evaporator, a second compressor, the first heat pump condenser and a second throttling apparatus, the first heat pump evaporator constituting a first end of a second heat exchange process; the first heat pump condenser constituting a second end of the second heat exchange process; and the second compressor and the second throttling apparatus promoting the second heat exchange process; and the second heat pump circulating system, comprising the second heat pump evaporator, a third compressor, the second heat pump condenser and a third throttling apparatus, the second heat pump evaporator constituting a first end of a third heat exchange process; the second heat pump condenser constituting a second end of the third heat exchange process; and the third compressor and the third throttling apparatus promoting the third heat exchange process.

12. The operation method for comprehensive utilization of renewable energy and waste heat according to claim 11, wherein a top layer of the water cistern is hot water and a bottom layer of the water cistern is cold water;

when the water cistern outlet water is hot water and return water is cold water, the water cistern carries out water circulation in a mode of outlet water at a top of the water cistern and return water at a bottom of the water cistern;

and when the water cistern outlet water is cold water and return water is hot water, the water cistern carries out water circulation in a mode of outlet water at the bottom of the water cistern and return water at the top of the water cistern.

13. The operation method for comprehensive utilization of renewable energy and waste heat according to claim 11, wherein a thermal insulation layer is provided at a top and in a periphery of the water cistern.

14. The operation method for comprehensive utilization of renewable energy and waste heat according to claim 11, wherein a heat source of the second heat pump evaporator comprises a water source of the water cistern or an air source; when a water pump drives the fifth water circulating loop, the water source of the water cistern serves as the heat source; when the fifth water circulating loop is shut down, a fan of the second heat pump evaporator is driven, and at this time, the air source serves as the heat source.

15. The operation method for comprehensive utilization of renewable energy and waste heat according to claim 11, wherein the set first period comprises spring, summer, and autumn; and the set second period comprises winter.

16. The operation method for comprehensive utilization of renewable energy and waste heat according to claim 11, wherein the heat storage process is a process of raising from water at 0° C. with a ice content to water at 90° C.;

and the heat release process is a process of reducing from water at 90° C. to water at 0° C. with a ice content.

\* \* \* \* \*